(12) United States Patent
Tanaka et al.

(10) Patent No.: US 8,963,679 B2
(45) Date of Patent: Feb. 24, 2015

(54) CONNECTION TERMINAL OF SHUNT RESISTOR, AND BATTERY STATE DETECTION DEVICE

(75) Inventors: Kazuyuki Tanaka, Shiga (JP); Kengo Aburaya, Shiga (JP); Yuuichi Watanabe, Shiga (JP); Kazumasa Sakata, Shiga (JP)

(73) Assignees: Furukawa Electric Co., Ltd, Tokyo (JP); Furukawa Automotive Systems Inc., Shiga (JP)

( * ) Notice: Subject to any disclaimer, the term of this patent is extended or adjusted under 35 U.S.C. 154(b) by 0 days.

(21) Appl. No.: 13/876,807

(22) PCT Filed: Mar. 30, 2012

(86) PCT No.: PCT/JP2012/002244
§ 371 (c)(1),
(2), (4) Date: Mar. 28, 2013

(87) PCT Pub. No.: WO2012/132470
PCT Pub. Date: Oct. 4, 2012

(65) Prior Publication Data
US 2014/0015636 A1 Jan. 16, 2014

(30) Foreign Application Priority Data
Mar. 31, 2011 (JP) ................... 2011-080402

(51) Int. Cl.
*H01C 1/144* (2006.01)
*G01R 1/20* (2006.01)
(Continued)

(52) U.S. Cl.
CPC ............... *H01C 1/144* (2013.01); *G01R 1/203* (2013.01); *H01C 1/14* (2013.01); *G01R 31/3696* (2013.01)

USPC .......................................... 338/329
(58) Field of Classification Search
CPC ................................ H01C 1/144; H01C 1/14
USPC .......................................... 338/325, 329, 332
See application file for complete search history.

(56) References Cited

U.S. PATENT DOCUMENTS 4,991,059 A * 2/1991 Kiyose ..................... 361/773
5,270,492 A * 12/1993 Fukui ....................... 174/68.1
(Continued)

FOREIGN PATENT DOCUMENTS

DE 19501719 A1 8/1996
DE 20117650 U1 3/2003
(Continued)

OTHER PUBLICATIONS

International Search Report for PCT/JP2012/002244, mailed Apr. 17, 2012, 3 pages.
(Continued)

*Primary Examiner* — Kyung Lee
(74) *Attorney, Agent, or Firm* — Amin, Turocy & Watson, LLP (57) ABSTRACT

It is an object to provide a configuration with an enhanced sensing accuracy, in which a shunt resistance main body and a terminal member are formed as separate pieces. A shunt resistor includes a resistance main body and a terminal member (21) that is electrically connected to the resistance main body. The terminal member (21) includes a resistance connection portion (23) to be in contact with the resistance main body, and a circuit connection portion (24) provided so as to extend from the resistance connection portion (23). The circuit connection portion (24) is divided into two parts by a slit (27) being formed therein. The slit (27) is formed up to a part of the resistance connection portion (23).

5 Claims, 5 Drawing Sheets

(51) Int. Cl.
*H01C 1/14* (2006.01)
*G01R 31/36* (2006.01)

(56) References Cited

U.S. PATENT DOCUMENTS

| | | | | |
|---|---|---|---|---|
| 5,287,083 | A | * | 2/1994 | Person et al. ............... 338/332 |
| 5,548,269 | A | * | 8/1996 | Katsuno et al. ............. 338/325 |
| 5,815,065 | A | * | 9/1998 | Hanamura .................. 338/309 |
| 6,515,844 | B1 | * | 2/2003 | Moriwaki et al. ......... 361/306.1 |
| 6,788,067 | B1 | | 9/2004 | Skerritt et al. |
| 6,828,667 | B2 | * | 12/2004 | Yamasaki et al. ............. 257/693 |
| 7,088,217 | B2 | | 8/2006 | Enomoto et al. |
| 7,148,785 | B2 | * | 12/2006 | Becker et al. ............... 338/22 R |
| 2004/0263150 | A1 | | 12/2004 | Hetzler |
| 2011/0285498 | A1 | * | 11/2011 | Yoneda et al. ............... 338/306 |

FOREIGN PATENT DOCUMENTS

| | | |
|---|---|---|
| DE | 102006039722 A1 | 2/2008 |
| JP | 1994-002603 | 1/1994 |
| JP | 2005129379 | 5/2005 |
| JP | 2009-98079 | 5/2009 |
| JP | 2009-244065 | 10/2009 |
| JP | 2009-266977 | 11/2009 |

OTHER PUBLICATIONS

European Search Report dated Jul. 2, 2014 for European Application No. 12764128.0, 6 pages.

* cited by examiner

PRIOR ART

ND BATTERY STATE
CONNECTION TERMINAL OF SHUNT RESISTOR, AND BATTERY STATE DETECTION DEVICE

CROSS-REFERENCE TO RELATED APPLICATIONS

The subject application is a US national stage application of PCT Application Serial No. PCT/JP2012/002244, filed Mar. 30, 2012, and entitled "CONNECTING TERMINAL OF SHUNT RESISTOR, AND BATTERY STATE DETECTING APPARATUS", which claims priority to Japanese Patent Application Serial No. 2011-080402, filed Mar. 31, 2011, the disclosures of which are incorporated herein by reference in their entirety.

TECHNICAL FIELD

The present invention mainly relates to a structure of a connection terminal of a shunt resistor included in a battery state detection device.

BACKGROUND ART

In an automobile and the like, a battery state detection device for detecting a battery state (such as the remaining amount of electricity) is provided. This type of battery state detection device includes a circuit for detecting a current of a battery. As a circuit for accurately detecting a large amount of current as in an automobile battery, a configuration using a shunt resistance is known. Patent Document 1 discloses a current monitoring device using a shunt resistor.

A four-terminal method is known as a configuration that detects a current by using a shunt resistor. A shunt resistance used in this four-terminal method is provided with four terminals in total, including a pair of terminals serving as an entry point and an exit point of a measurement object current and a pair of terminals connecting a voltage measurement circuit for measuring a potential difference occurring between both ends of the shunt resistance due to the measurement object current. Patent Document 1 shows, in FIG. 2, a four-terminal shunt resistor that is divided into two parts by a slit formed in a current conducting direction and integrally formed into a shape having two pairs of legs.

PRIOR-ART DOCUMENTS

Patent Documents

Patent Document 1: Japanese Patent Application Laid-Open No. 2009-98079

SUMMARY OF THE INVENTION

Problems to be Solved by the Invention

As mentioned above, in the four-terminal shunt resistor, it is necessary to form a terminal having a bifurcated shape. Therefore, as shown in the Patent Document 1, a process such as formation of a slit in a shunt resistance main body is required, and additionally a material loss occurs. Moreover, in a case of detecting a large amount of current as in an automobile battery, the size of the shunt resistance main body increases, which makes it difficult to form a terminal having a complicated shape.

Figure 6:
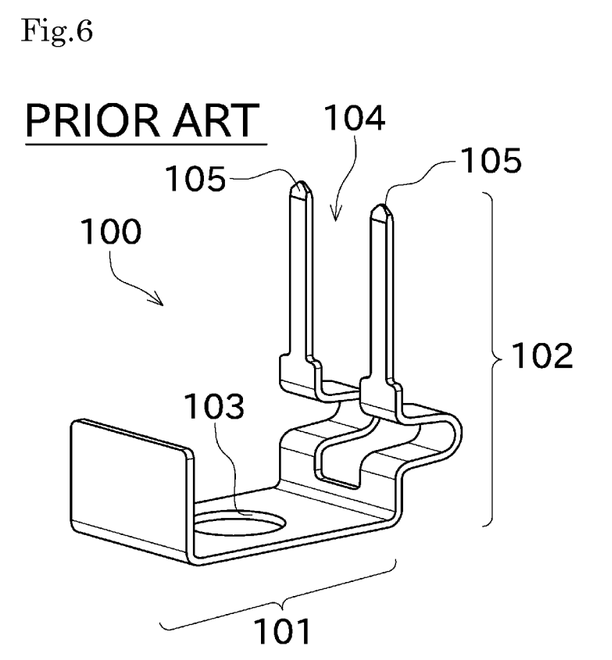
[FIG. 6] A perspective view of the conventional terminal member.

Therefore, a configuration in which a shunt resistance main body and a terminal member are formed as separate pieces has been proposed. As shown in FIG. 6, such a terminal member 100 is formed by a metal plate being subjected to a pressing process and a folding process, and has a resistance connection portion 101 and a circuit connection portion 102.

The resistance connection portion 101 is a portion to be in contact with the shunt resistance main body. The resistance connection portion 101 has a screwing hole 103. A screw is threaded through the screwing hole 103 into the shunt resistance main body, and thereby the terminal member 100 and the shunt resistance main body are fastened to each other, and electrically connected to each other.

The circuit connection portion 102 is provided so as to extend from the resistance connection portion 101. The circuit connection portion 102 has a slit 104, and thus the circuit connection portion 102 is divided into two parts so that two circuit connection terminals 105 are formed. One of the two circuit connection terminals 105 serves as an entry/exit point of a current to/from the shunt resistance main body, and the other is connected to a voltage measurement circuit for measuring a potential difference occurring in the shunt resistance due to the current.

The terminal members 100 each having the two circuit connection terminals 105 in this manner are screwed to appropriate two positions on the shunt resistance main body. Thereby, a four-terminal shunt resistor having four circuit connection terminals 105 in total is formed.

In the above-described configuration, it is not necessary to form a terminal in the shunt resistance main body, and therefore a process is easy and also a material loss in the shunt resistance is minimized. Moreover, since the terminal member 100 and the shunt resistance main body are separate pieces, a complicated shape can be set in the terminal member 100, which enhances the degree of freedom in designing a circuit.

However, forming the shunt resistance main body and the terminal member 100 as separate pieces in the above-described manner sometimes causes failure to obtain a sufficient sensing accuracy.

The present invention is made in view of the circumstances described above, and a primary object of the present invention is to provide a configuration with an enhanced sensing accuracy, in which a shunt resistance main body and a terminal member are formed as separate pieces.

Means for Solving the Problems and Effects Thereof

The problem to be solved by the present invention is as described above, and next, means for solving the problem and effects thereof will be described.

In an aspect of the present invention, a shunt resistor having the following configuration is provided. That is, the shunt resistor includes a resistance main body and a terminal member that is electrically connected to the resistance main body. The terminal member includes a resistance connection portion to be in contact with the resistance main body, and a circuit connection portion provided so as to extend from the resistance connection portion. The circuit connection portion is divided into two parts by a slit being formed therein. The slit is formed up to a part of the resistance connection portion.

Since, in this manner, the slit dividing the circuit connection portion into two parts is formed up to the resistance connection portion, the two parts of the divided circuit connection portion are not continuous with each other in root portions thereof. Therefore, paths of currents flowing in the two parts of the divided circuit connection portion do not cross each other. As a result, the currents flowing in the respective two parts of the divided circuit connection portion are stabilized, and thus the sensing accuracy in current detection using this shunt resistor is enhanced. Additionally, since the slit is formed only in a part of the resistance connection portion, the terminal member is not completely divided into two parts but continuous in the resistance connection portion. Accordingly, the number of parts of a terminal does not increase, and an operation for mounting the terminal member to the resistance main body is required only once. Thus, an assembling cost does not increase.

The shunt resistor described above is preferably configured as follows. That is, in the resistance connection portion, a coupling portion that is physically and electrically coupled to the resistance main body is formed. The slit is formed up to at least a part of the coupling portion.

Since, in this manner, the slit is formed up to a portion where the terminal member is coupled to the resistance main body, the independence between the two parts of the divided circuit connection portion is enhanced, thus crossing of the current paths is not likely to occur. Accordingly, the sensing accuracy in current detection using this shunt resistor is further enhanced.

The shunt resistor described above is preferably configured as follows. That is, the terminal member is fastened to the resistance main body by a fastener, and thereby physically and electrically coupled to the resistance main body. The coupling portion is an insertion hole formed in the resistance connection portion for insertion of the fastener therethrough. The slit is formed in communication with the insertion hole.

In this manner, the terminal member and the resistance main body are coupled to each other by the fastener, and thereby they can be firmly joined to each other. Also, by forming the slit up to the insertion hole for insertion of the fastener therethrough, the independence between the two parts of the divided circuit connection portion is enhanced, and thus crossing of the current paths is not likely to occur. Therefore, the sensing accuracy in current detection using this shunt resistor is further enhanced.

The shunt resistor described above is preferably configured as follows. That is, in the resistance connection portion, at least one pair of protrusions protruding toward the resistance main body are provided, the at least one pair of protrusions being provided such that the slit formed in the resistance connection portion is positioned therebetween.

Providing the protrusions in this manner can stabilize the contact between the resistance main body and the terminal member, and enhance the certainty of the electrical connection therebetween. That is, providing a pair of the protrusions with the slit therebetween results in providing the protrusions each corresponding to each of the two parts of the divided circuit connection portion. Therefore, crossing of the paths of the currents flowing in the respective two parts of the divided circuit connection portion is not likely to occur, and thus the sensing accuracy is further enhanced.

It is also possible that the shunt resistor described above is configured as follows. That is, the coupling portion is a welded portion formed between the resistance main body and the resistance connection portion.

In this manner, by coupling the terminal member and the resistance main body to each other by welding, the electrical connection therebetween is ensured. Additionally, by forming the slit up to the welded portion, the independence between the two parts of the divided circuit connection portion is enhanced so that crossing of the current paths is not likely to occur. Therefore, the sensing accuracy in current detection using this shunt resistor is further enhanced.

In another aspect of the present invention, a battery state detection device including the shunt resistor described above and a circuit board to which the circuit connection portion of the shunt resistor is connected, is provided.

The battery state detection device enables accurate detection of a current flowing in the circuit board.

BRIEF DESCRIPTION OF THE DRAWINGS

[FIG. 3] (a) A plan view of a conventional terminal member; and (b) A plan view of the terminal member according to the first embodiment.

[FIG. 4] (a) A perspective view of a terminal member according to a second embodiment; (b) A side view of the terminal member; and (c) A bottom view of the terminal member.

[FIG. 5] (a) A perspective view of a terminal member according to a modification of the second embodiment; (b) A side view of the terminal member; and (c) A bottom view of the terminal member.

EMBODIMENT FOR CARRYING OUT THE INVENTION

Next, a first embodiment of the present invention will be described with reference to the drawings.

Figure 1:
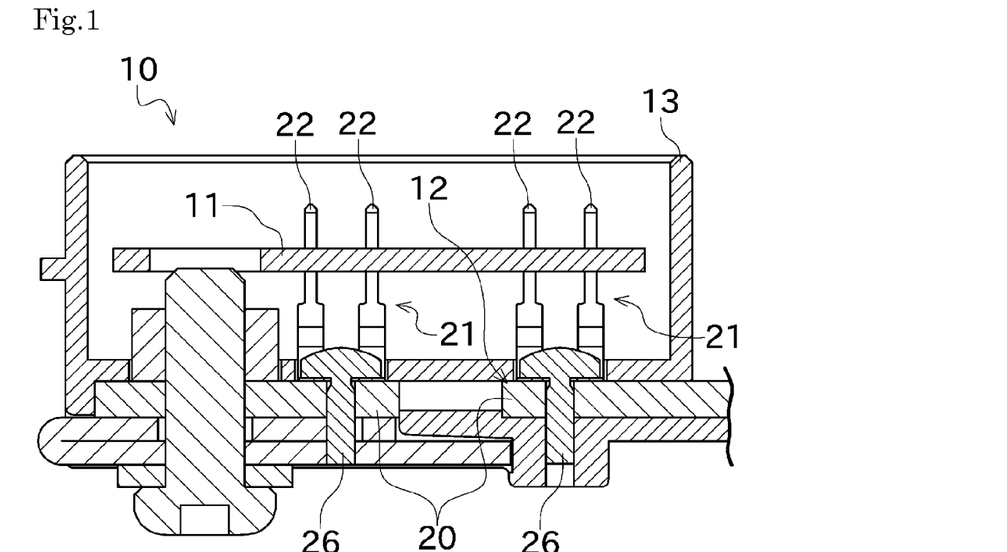
[FIG. 1] A cross-sectional front elevation view of a battery state detection device according to a first embodiment.

FIG. 1 shows a front elevation view of a battery state detection device 10 according to this embodiment. As shown in FIG. 1, the battery state detection device 10 includes a circuit board 11, a shunt resistor 12, and a casing 13 for accommodating them.

The battery state detection device 10 is configured to be connected to a battery provided in a vehicle or the like, and to measure the current balance, the temperature, the impedance, and the like, of the battery, to determine a charged state and a degraded state, and to output a measurement result and a determination result. On the circuit board 11, a micro processor (not shown) for making the above-described determination, and the like, are arranged.

A current detection object circuit is formed on the circuit board 11. By measuring a current that flows in the current detection object circuit, the current balance of the battery is measured. The shunt resistor 12 is connected to the current detection object circuit mentioned above. On the board, an A/D converter (not shown) for detecting a potential difference occurring in the shunt resistor 12 is arranged. The micro processor can obtain a current value of the current flowing in the current detection object circuit based on the potential difference mentioned above.

The shunt resistor 12 includes a resistance main body 20 and terminal members 21. In the shunt resistor 12 of this embodiment, the terminal members 21 and the resistance main body 20 are formed as separate pieces. The terminal members 21 are fixed to the resistance main body 20 by screwing.

Two terminal members 21 are provided to appropriate positions on the resistance main body 20. In the battery state detection device 10 of this embodiment, the known four-terminal method is adopted as a current detection method. Therefore, a distal end of each terminal member 21 is bifurcated to form two circuit connection terminals 22. Accordingly, the shunt resistor 12 of this embodiment has four circuit connection terminals 22 in total.

Next, a configuration of the terminal member 21 will be described in detail.

Figure 2:
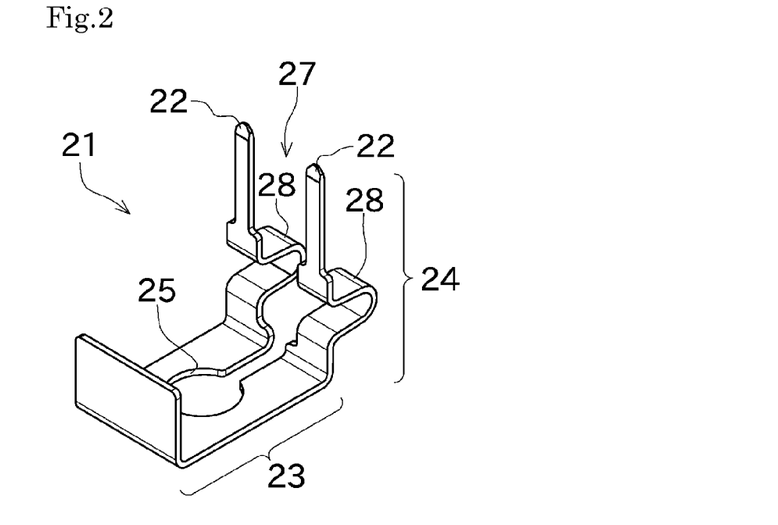
[FIG. 2] A perspective view of a terminal member.

As shown in FIG. 2, the terminal member 21 has a resistance connection portion 23 and a circuit connection portion 24.

The resistance connection portion 23 is a portion to be in contact with the resistance main body 20. The resistance connection portion 23 is fastened to the resistance main body 20 by a fastener, and thereby physically and electrically coupled to the resistance main body 20. More specifically, as shown in FIG. 2, the resistance connection portion 23 has a screwing hole (insertion hole) 25. Through the screwing hole 25, a screw (fastener) 26 (FIG. 1) is threaded into the resistance main body 20, and thereby the terminal member 21 and the resistance main body 20 are physically fixed to each other and electrically connected to each other. Since, in this manner, the terminal member 21 and the resistance main body 20 are coupled to each other through the screwing hole 25, it can be said that the screwing hole 25 is a coupling portion.

The circuit connection portion 24 is provided so as to extend from the resistance connection portion 23 and also so as to be bent substantially at a right angle from the resistance connection portion 23. The circuit connection portion 24 has a slit 27, and thereby the circuit connection portion 24 is divided into two parts. Each of the two parts of the divided circuit connection portion 24 serves as the circuit connection terminal 22. As shown in FIG. 1, each of the circuit connection terminals 22 protrudes from the circuit board 11, and is connected to an electrical circuit on the circuit board 11 by appropriate means such as soldering. One of the two circuit connection terminals 22 is connected to the A/D converter through the current detection object circuit.

In the middle of the circuit connection terminal 22, a buffer portion 28 that is bent with a substantially U-shaped cross-section is formed. The buffer portion 28 allows a stress caused by linear expansion to escape.

Next, a characteristic configuration of the present invention will be described.

Providing the resistance main body and the terminal member as separate pieces as described above sometimes causes failure to achieve a sufficient sensing accuracy. The inventors of the present application found out that making an improvement in the shape of the terminal member can enhance the sensing accuracy, and have completed the invention of the present application.

Figure 3:
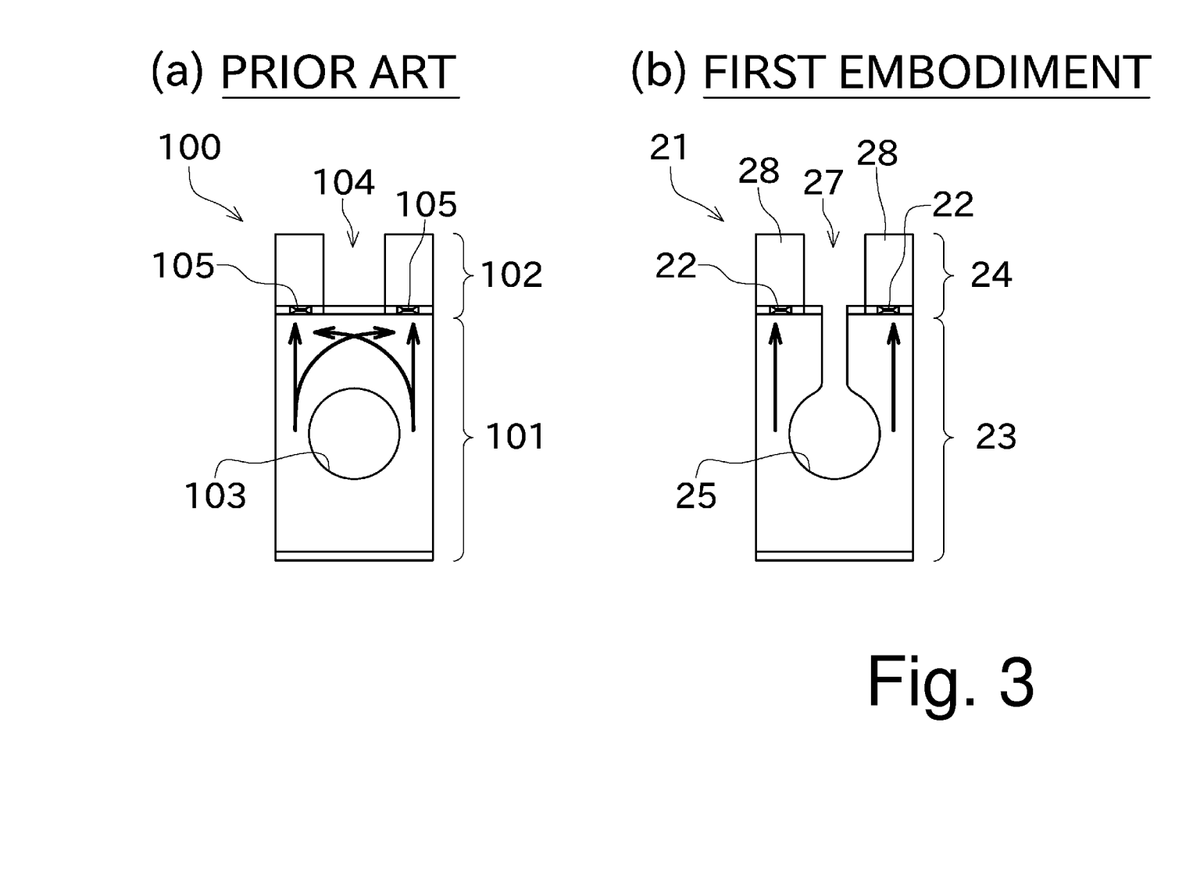

That is, in the conventional terminal member 100, as shown in FIG. 6, the slit 104 is formed only in a part of the circuit connection portion 102. In other words, the slit 104 is not formed in the resistance connection portion 101 that is in contact with the resistance main body. Accordingly, as shown in FIG. 3(a), paths (indicated by the thick arrows in the drawing) of currents flowing in the two circuit connection terminals 105 cross each other in the resistance connection portion 101. It is considered that such crossing of the current paths causes the currents flowing into the respective circuit connection terminals 105 to be unstable, and consequently lowers the sensing accuracy.

Additionally, in a case of measuring a potential difference occurring in the shunt resistor in which the terminal member and the resistance main body are separate pieces, not only a voltage drop due to a resistance value of a shunt resistance but also a voltage drop due to a contact resistance between the terminal member and the resistance main body is measured. In the conventional terminal member 100, the terminal member 100 and the resistance main body are in contact with each other through a large area in root portions of the circuit connection terminals 105, and thus the voltage drop due to the contact resistance is increased. In this respect as well, a measurement accuracy is lowered.

Therefore, in the terminal member 21 of this embodiment, the slit 27 is formed throughout the length of the circuit connection portion 24 in a longitudinal direction of the circuit connection terminals 22. That is, the circuit connection portion 24 is completely divided into two parts. Furthermore, an end of the slit 27 reaches the resistance connection portion 23. To be more specific, the slit 27 communicates with the screwing hole 25. Accordingly, the circuit connection terminals 22 are not in contact with each other in their root portions (portions in contact with the resistance main body 20). This manner of formation increases the independence between the two circuit connection terminals 22. As a result, as shown in FIG. 3(b), paths (indicated by the thick arrows in the drawing) of currents flowing in the circuit connection terminals 22 do not cross each other in the resistance connection portion 23. Since the current paths do not cross each other in this manner, the currents flowing into the respective circuit connection terminals 22 are stabilized, and thus the sensing accuracy can be enhanced.

Moreover, in the terminal member 21 of this embodiment, the slit 27 is formed in the above-described manner, and therefore the circuit connection terminal 22 is, in its root portion thereof, in contact with the resistance main body 20 through a small area. That is, the resistance main body 20 in which the current flows and the A/D converter that measures a potential difference occurring in the resistance main body 20 can be connected to each other at one point. This reduces a voltage drop due to a contact resistance between the terminal member 21 and the resistance main body 20. In this respect as well, the sensing accuracy can be enhanced.

As shown in FIG. 2 and the like, in the terminal member 21 of this embodiment, the slit 27 is formed halfway through the resistance connection portion 23 (up to the screwing hole 25). That is, the terminal member 21 is not completely divided into two parts. Thus, the terminal member 21 of this embodiment can be handled as one part while the independence between the two circuit connection terminals 22 is increased. Additionally, the terminal member 21 of this embodiment can be fixed to the resistance main body 20 by one screwing. Therefore, a trouble required for assembling the shunt resistor 12 of this embodiment is similar to that for a shunt resistor having the conventional terminal member 100, and thus neither the assembling cost nor the number of parts increases.

As described above, the shunt resistor 12 of this embodiment includes the resistance main body 20 and the terminal member 21 that is electrically connected to the resistance main body 20. The terminal member 21 has the resistance connection portion 23 to be in contact with the resistance main body 20, and the circuit connection portion 24 provided so as to extend from the resistance connection portion 23. The circuit connection portion 24 is divided into two parts by the slit 27 being formed therein. The slit 27 is formed up to a part of the resistance connection portion 23.

Since, in this manner, the slit 27 that divides the circuit connection portion 24 into two parts is formed up to the resistance connection portion 23, the two circuit connection terminals 22 are not connected to each other in the root portions thereof. Therefore, the paths of the currents flowing in the circuit connection terminals 22 do not cross each other. This allows the currents flowing in the respective two circuit connection terminals 22 to be stabilized, and thus the sensing accuracy in current detection using the shunt resistor 12 is enhanced. Moreover, since the slit 27 is formed only in a part of the resistance connection portion 23, the terminal member 21 is not completely divided into two parts but continuous in the resistance connection portion 23. Accordingly, the number of parts of the terminal does not increase, and an operation for mounting the terminal member 21 to the resistance main body 20 is required only once. Thus, the assembling cost does not increase.

The shunt resistor 12 of this embodiment is configured as follows. That is, the terminal member 21 is fastened to the resistance main body 20 by the screw 26, and thereby physically and electrically coupled to the resistance main body 20. The resistance connection portion 23 has the screwing hole 25 through which the screw 26 is inserted for the screwing. The slit 27 is formed in communication with the screwing hole 25.

In this manner, the terminal member 21 and the resistance main body 20 are coupled to each other by the screw 26, and thereby they can be firmly joined to each other. Also, by forming the slit 27 up to the screwing hole 25, the independence between the two circuit connection terminals 22 is enhanced, and thus crossing of the current paths is not likely to occur. Therefore, the sensing accuracy in current detection using this shunt resistor 12 is further enhanced.

The battery state detection device 10 of this embodiment includes the above-described shunt resistor 12, and the circuit board 11 to which the circuit connection terminals 22 of the shunt resistor 12 are connected.

This battery state detection device 10 enables accurate detection of the current flowing in the circuit board 11.

Next, a modification of the above-described first embodiment will be described.

In the above-described first embodiment, the resistance connection portion 23 is screwed to the resistance main body 20. However, a method for connecting the resistance connection portion 23 and the resistance main body 20 to each other is not limited to the screwing, and an appropriate method is adoptable. For example, in a modification described below, the resistance connection portion 23 and the resistance main body 20 are physically and electrically coupled to each other by welding. The slit 27 is formed up to a portion where the resistance connection portion 23 and the resistance main body 20 are welded to each other. Forming the slit 27 in this manner can enhance the independence between the two circuit connection terminals 22, and therefore the same effect as the effect of the above-described first embodiment, that is, the enhancement of the sensing accuracy, is obtained. In this case, the screwing hole 25 is not necessary, and may be omitted.

As described above, in this modification, the slit 27 is formed up to a welded portion formed between the resistance main body 20 and the resistance connection portion 23.

In this manner, by coupling the terminal member 21 and the resistance main body 20 to each other by welding, the electrical connection therebetween is ensured. Additionally, by forming the slit 27 up to the welded portion, the independence between the two circuit connection terminals 22 is enhanced so that crossing of the current paths is not likely to occur. Therefore, the sensing accuracy in current detection using this shunt resistor is further enhanced.

Next, a second embodiment of the present invention will be described. Here, as for any configuration identical or similar to that of the above-described first embodiment, the same reference numeral is given to an element and shown on the drawings, and a description thereof is omitted.

Figure 4:
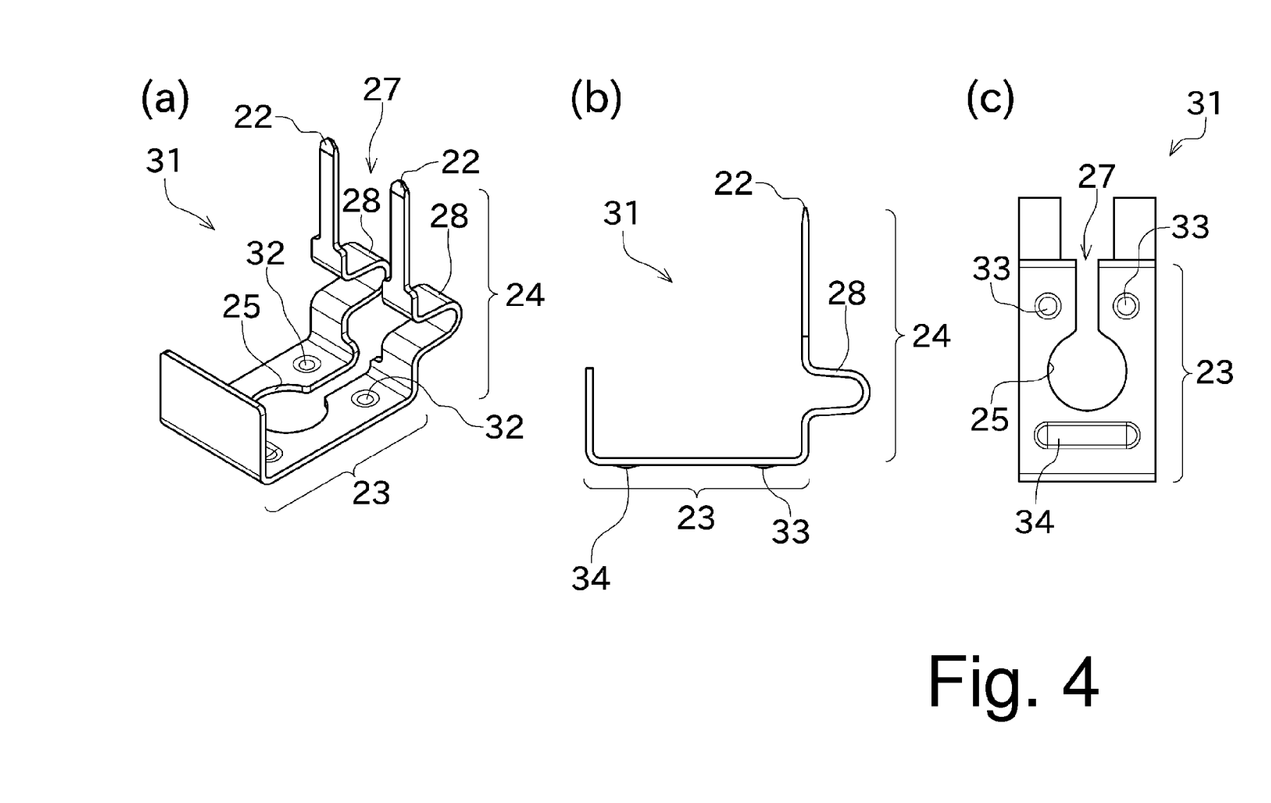

FIG. 4 shows a terminal member 31 according to the second embodiment. As shown in FIG. 4(a), in the resistance connection portion 23 of this terminal member 31, circular dimples 32 are formed on a surface opposite to a surface in contact with the resistance main body 20. As a result, on the surface opposite to the surface having the dimples 32 formed thereon, that is, on the surface in contact with the resistance main body 20 (the surface facing downward in FIG. 4(b)), protrusions 33 protruding toward the resistance main body 20 are formed.

Since the protrusions are formed in the resistance connection portion 23 in this manner, the contact between the resistance connection portion 23 and the resistance main body 20 is stabilized when they are screwed to each other. This further ensures the electrical connection between the resistance main body 20 and the terminal member 31.

Moreover, as shown in FIG. 4(c), the protrusions 33 are formed in a pair such that the slit 27 formed in the resistance connection portion 23 is positioned therebetween. This achieves a configuration in which, in the root portions of the circuit connection terminals 22, the protrusions 33 are provided each corresponding to each of the circuit connection terminals 22. This configuration enables each of the circuit connection terminals 22 to be surely connected to the resistance main body 20. Therefore, the current flowing in each of the circuit connection terminals 22 is stabilized. Furthermore, since the protrusions 33 are provided for the respective circuit connection terminals 22, the independence between the circuit connection terminals 22 is further enhanced, so that crossing of the current paths is not likely to occur.

In the terminal member 31 of this embodiment, a protrusion 34 having an oval shape is formed at the side opposite to the two protrusions 33 across the screwing hole 25. As a result, when the terminal member 31 is screwed to the resistance main body 20, the terminal member 31 is supported on three points by the two protrusions 33 and the protrusion 34. This can ensure alignment.

As described above, the terminal member 31 included in the shunt resistor of the second embodiment is configured as follows. That is, in the resistance connection portion 23, a pair of protrusions 33 protruding toward the resistance main body 20 are provided such that the slit 27 formed in the resistance connection portion 23 is positioned therebetween.

Providing the protrusions 33 in this manner can stabilize the contact between the resistance main body 20 and the terminal member 21, and enhance the certainty of the electrical connection therebetween. That is, providing a pair of the protrusions 33 with the slit 27 therebetween results in providing the protrusions 33 each corresponding to each of the two circuit connection terminals 22. Therefore, crossing of the paths of the currents flowing in the two circuit connection terminals 22 is not likely to occur, and thus the sensing accuracy is further enhanced.

Next, a modification of the above-described second embodiment will be described with reference to FIG. 5.

Figure 5:
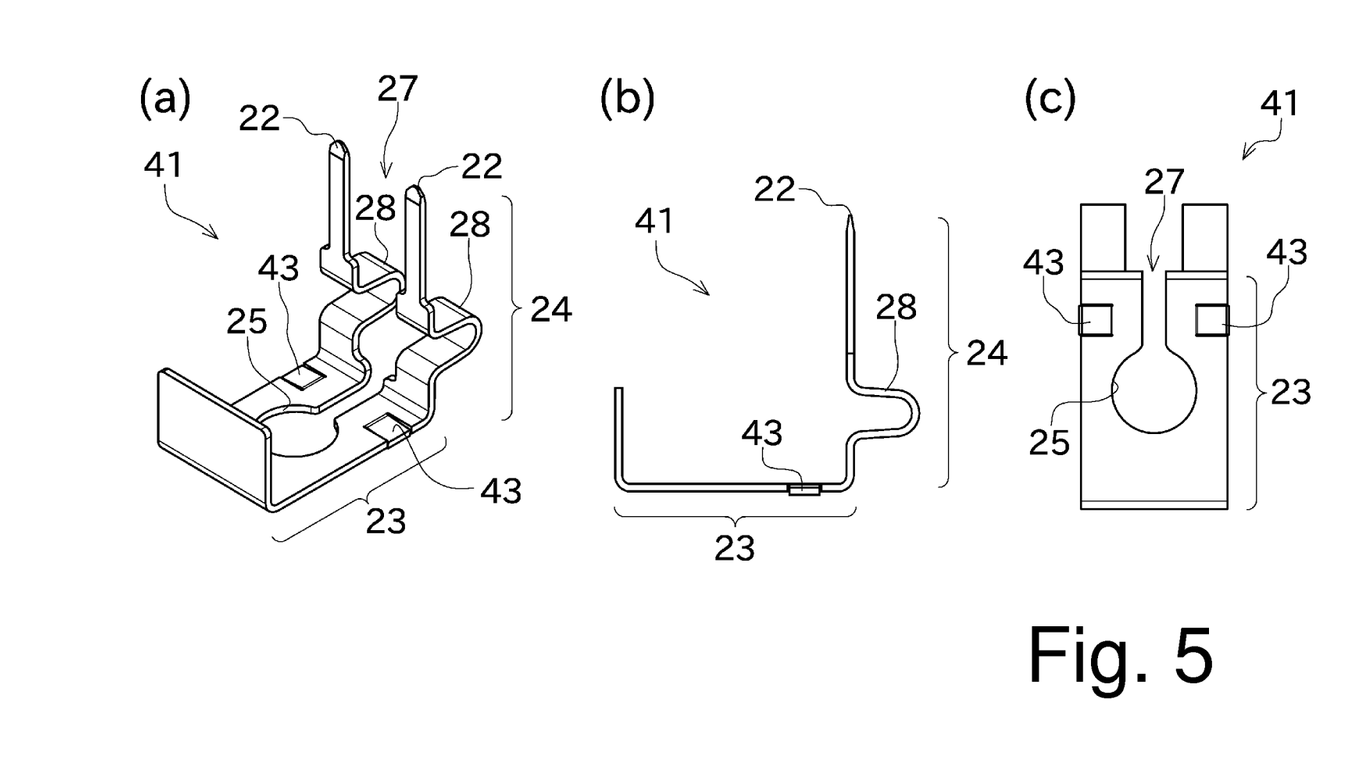

As shown in FIG. 5, in a terminal member 41 according to this modification, wings 43, instead of the protrusions 33 described above, are formed in the resistance connection portion 23. The wing 43 is formed by making two parallel cuts in the resistance connection portion 23 and slightly bending a portion between these cuts toward the resistance main body 20 side. As a result of the bending, a distal end of the wing 43 slightly protrudes toward the resistance main body 20 (accordingly, the wing 43 can be also recognized as a protrusion). Furthermore, in the terminal member 41 of this modification, similarly to the protrusions 33 of the above-described second embodiment, the wings 43 are formed in a pair such that the slit 27 formed in the resistance connection portion 23 is positioned therebetween.

When the terminal member 41 having this configuration is screwed to the resistance main body 20, the wings 43 are elastically deformed to make the resistance connection portion 23 flat. However, in portions of the wings 43, contact pressure between the resistance connection portion 23 and the resistance main body 20 is high. Accordingly, the electrical connection therebetween is ensured, and the reliability can be enhanced.

While some preferred embodiments of the present invention and modifications thereof have been described above, the above-described configurations may be modified, for example, as follows.

The shape of the terminal member is not necessarily limited to the illustrated ones. For example, although, in the drawing, the circuit connection portion 24 is bent substantially at a right angle from the resistance connection portion 23, it is not always necessary that the circuit connection portion 24 is bent from the resistance connection portion 23 in this manner. Moreover, the buffer portion 28 can be omitted.

The fastener for fastening the resistance main body 20 and the terminal member 21 to each other is not limited to a screw. For example, in a possible configuration, they may be fastened to each other by crimping.

Applications of the shunt resistor of the present invention are not limited to measurement of a battery current, but the shunt resistor of the present invention can be widely used for measurement of a current.

DESCRIPTION OF REFERENCE NUMERALS 10 battery state detection device
11 circuit board
12 shunt resistor
20 resistance main body
21 terminal member
25 screwing hole (coupling portion)
27 slit
33 protrusion

The invention claimed is:

1. A shunt resistor comprising:
a resistance main body; and
a terminal member that is electrically connected to the resistance main body,
wherein
the terminal member includes:
    a resistance connection portion to be in contact with the resistance main body; and
    a circuit connection portion provided so as to extend from the resistance connection portion,
the circuit connection portion is divided into two parts by a slit being formed therein,
the slit is formed up to a part of the resistance connection portion,
in the resistance connection portion, a coupling portion that is physically and electrically coupled to the resistance main body is formed,
the slit is formed up to at least a part of the coupling portion,
the terminal member is fastened to the resistance main body by a fastener, and thereby physically and electrically coupled to the resistance main body,
the coupling portion is an insertion hole formed in the resistance connection portion for insertion of the fastener therethrough, and
the slit is formed in communication with the insertion hole.

2. A shunt resistor, comprising:
a resistance main body; and
a terminal member that is electrically connected to the resistance main body,
wherein
the terminal member includes:
    a resistance connection portion to be in contact with the resistance main body; and
    a circuit connection portion provided so as to extend from the resistance connection portion,
the circuit connection portion is divided into two parts by a slit being formed therein,
the slit is formed up to a part of the resistance connection portion, and
in the resistance connection portion, at least one pair of protrusions protruding toward the resistance main body are provided, the at least one pair of protrusions being provided such that the slit formed in the resistance connection portion is positioned therebetween.

3. The shunt resistor according to claim, wherein
the coupling portion is a welded portion formed between the resistance main body and the resistance connection portion.

4. A battery state detection device comprising:
the shunt resistor according to claim 1; and
a circuit board to which the circuit connection portion of the shunt resistor is connected.

5. A battery state detection device comprising:
the shunt resistor according to claim 2; and
a circuit board to which the circuit connection portion of the shunt resistor is connected.

* * * * *